(12) United States Patent
Takasaki

(10) Patent No.: US 7,375,454 B2
(45) Date of Patent: May 20, 2008

(54) SURFACE ACOUSTIC WAVE EXCITATION DEVICE

(75) Inventor: Masaya Takasaki, Saitama (JP)

(73) Assignee: National University Corporation Saitama University, Saitama (JP)

( * ) Notice: Subject to any disclaimer, the term of this patent is extended or adjusted under 35 U.S.C. 154(b) by 0 days.

(21) Appl. No.: 11/785,290

(22) Filed: Apr. 17, 2007

(65) Prior Publication Data
US 2007/0247019 A1    Oct. 25, 2007

Related U.S. Application Data

(63) Continuation of application No. PCT/JP2005/019229, filed on Oct. 19, 2005.

(30) Foreign Application Priority Data
Oct. 19, 2004    (JP) .............................. 2004-304258

(51) Int. Cl.
    *H03H 9/25*    (2006.01)
(52) U.S. Cl. .................. 310/313 R; 310/354
(58) Field of Classification Search ............ 310/313 R, 310/344, 354, 355
    See application file for complete search history.

(56) References Cited

U.S. PATENT DOCUMENTS

| 4,454,440 | A | * | 6/1984 | Cullen ..................... 310/313 R |
| 5,323,081 | A | * | 6/1994 | Hasleberg ............... 310/313 R |
| 7,198,981 | B2 | * | 4/2007 | Avramescu et al. ......... 438/107 |

FOREIGN PATENT DOCUMENTS

| JP | 6-252684 | * | 9/1994 |
| JP | 2002-342016 | * | 11/2002 |
| JP | 2003-174351 | * | 6/2003 |
| JP | 2004-228689 | * | 8/2004 |

* cited by examiner

*Primary Examiner*—Thomas M Dougherty
(74) *Attorney, Agent, or Firm*—Westerman, Hattori, Daniels & Adrian, LLP.

(57) ABSTRACT

[Problems]

To provide a surface acoustic wave excitation device for efficiently exciting the surface acoustic wave on the surface of a material such as glass having free size and shape for making mechanical vibration available.

[Means to Solve the Problems]

The surface acoustic wave excitation device according to the present invention comprises a non-piezoelectric member 30 such as glass, a piezoelectric member 20, interdigital transducers 11 interposed between the non-piezoelectric member 30 and the piezoelectric member 20, and pre-pressurizing means 42 for pressing the piezoelectric member 20 onto the non-piezoelectric member 30 by way of the interdigital transducers. Alternating voltage is applied to the interdigital transducers 11 for exciting the surface acoustic wave on the non-piezoelectric member 30. Standing waves are generated in the piezoelectric member 20 by applying alternating voltage to the interdigital transducers 11, thereby allowing alternating strains to propagate to the non-piezoelectric member 30 such as a glass substrate or the like by way of the electrodes 11 and exciting the surface acoustic wave for making mechanical vibration of the non-piezoelectric member 30 available.

7 Claims, 21 Drawing Sheets

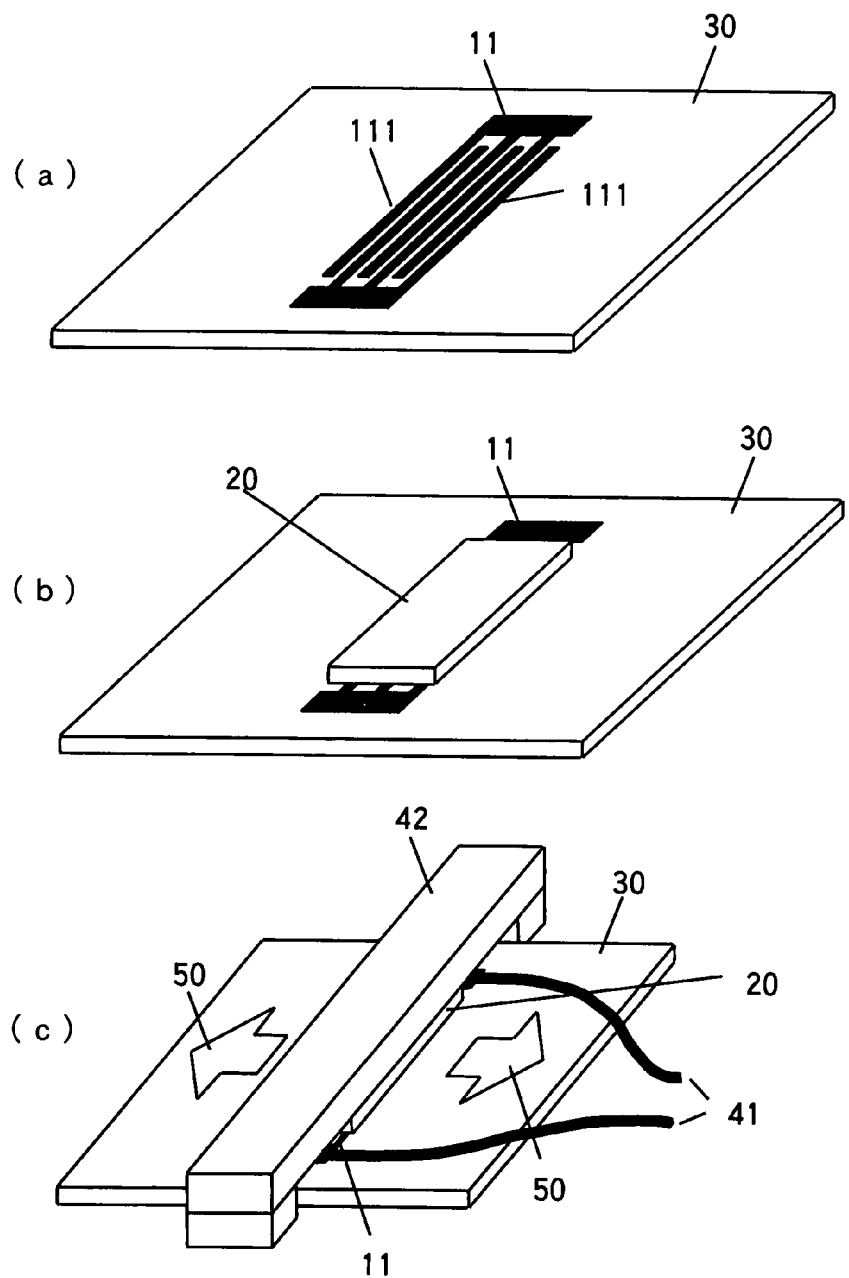
[Fig. 1]

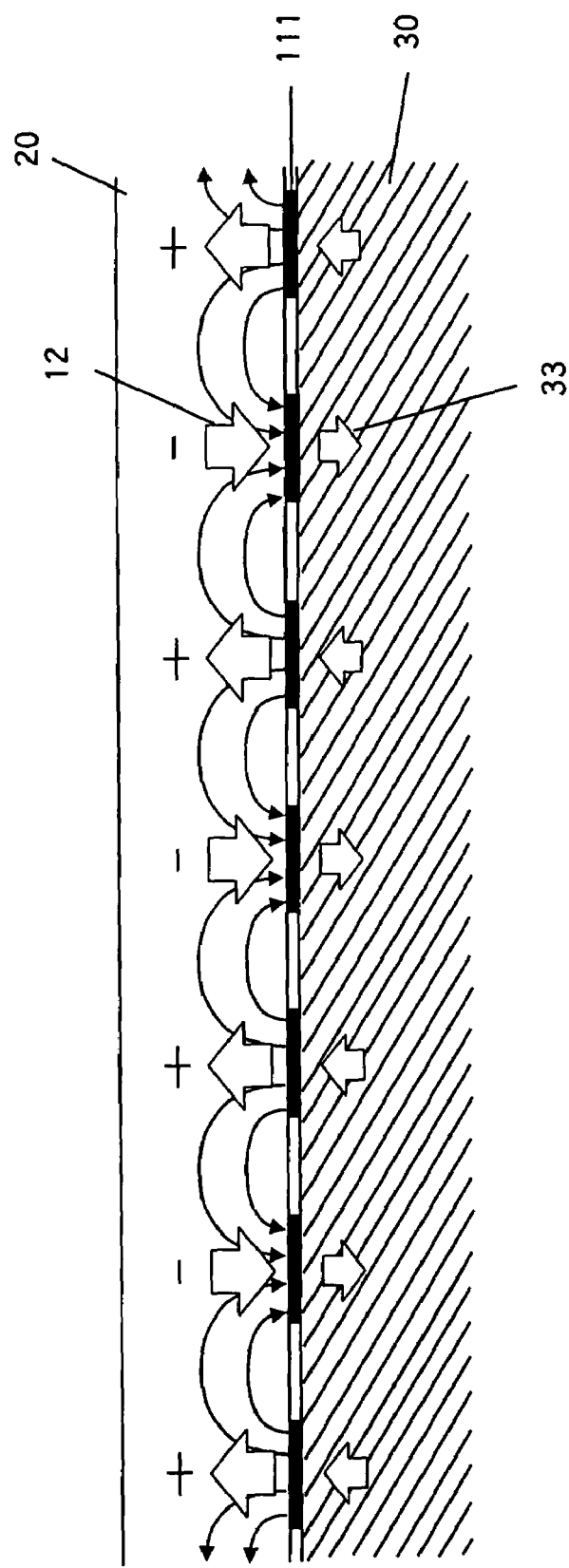

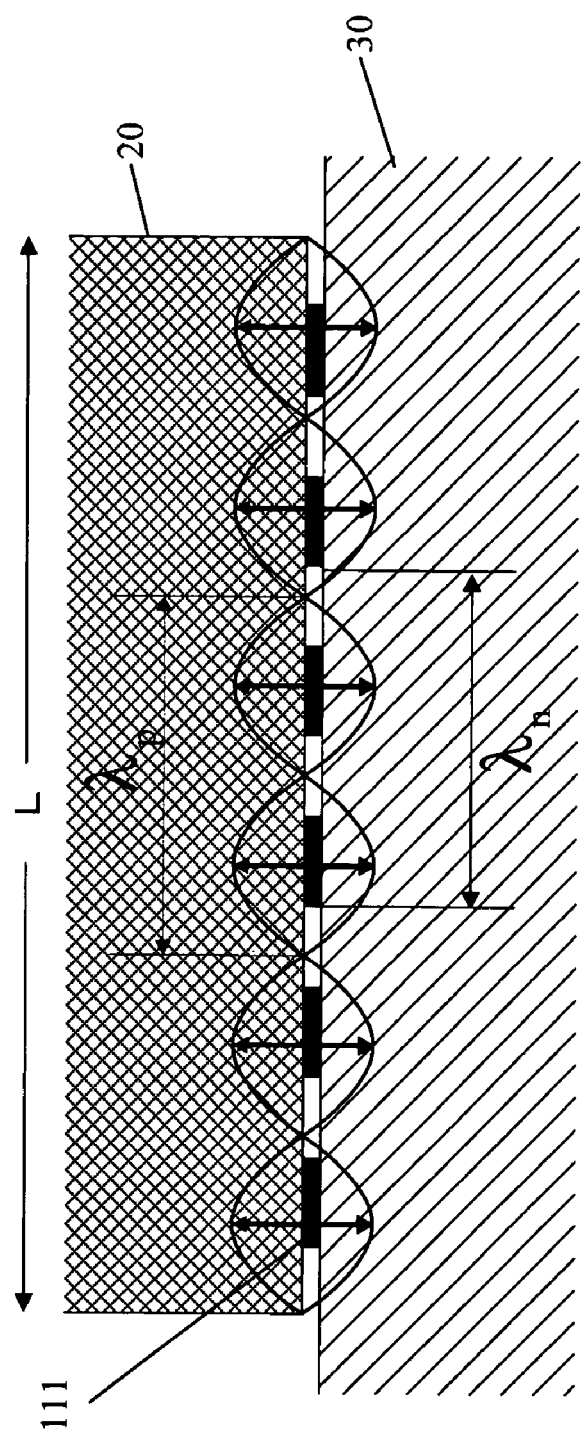
[Fig. 3]

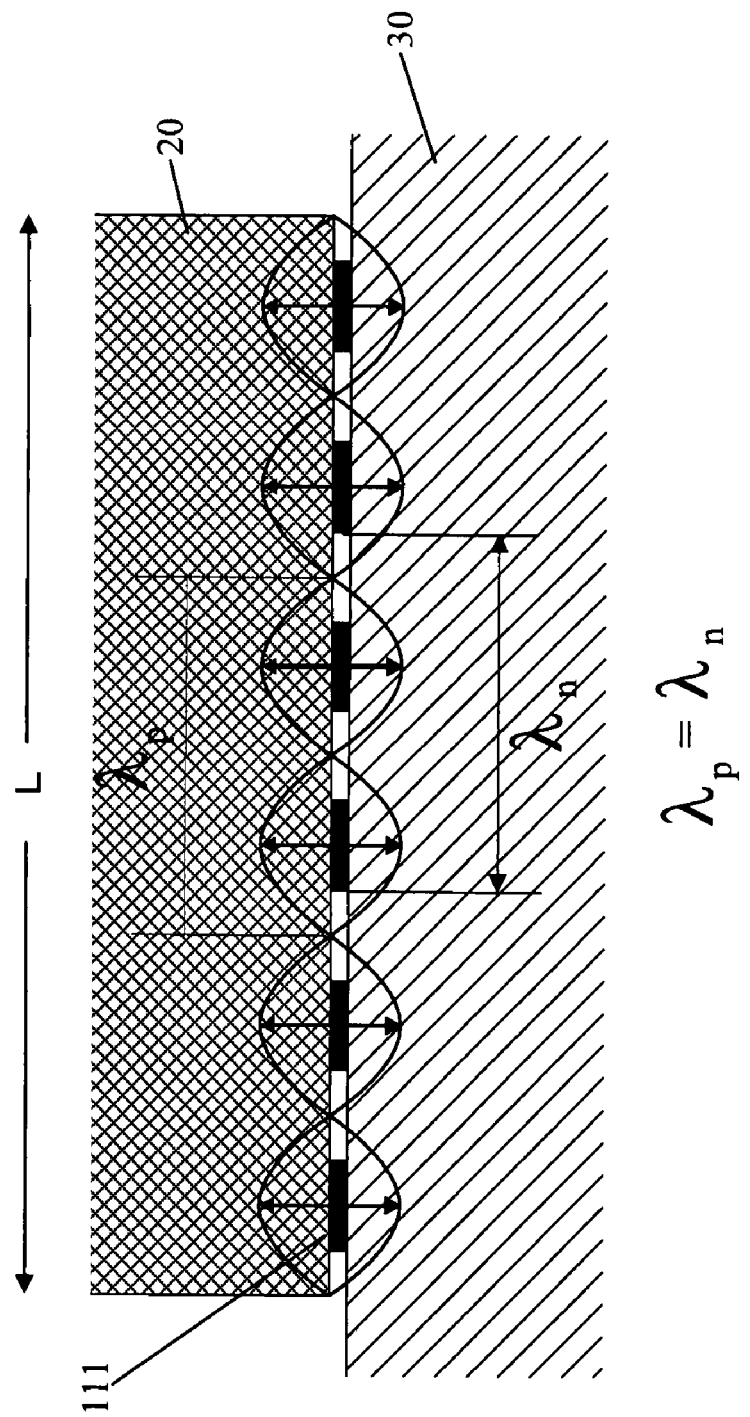
[Fig. 4]

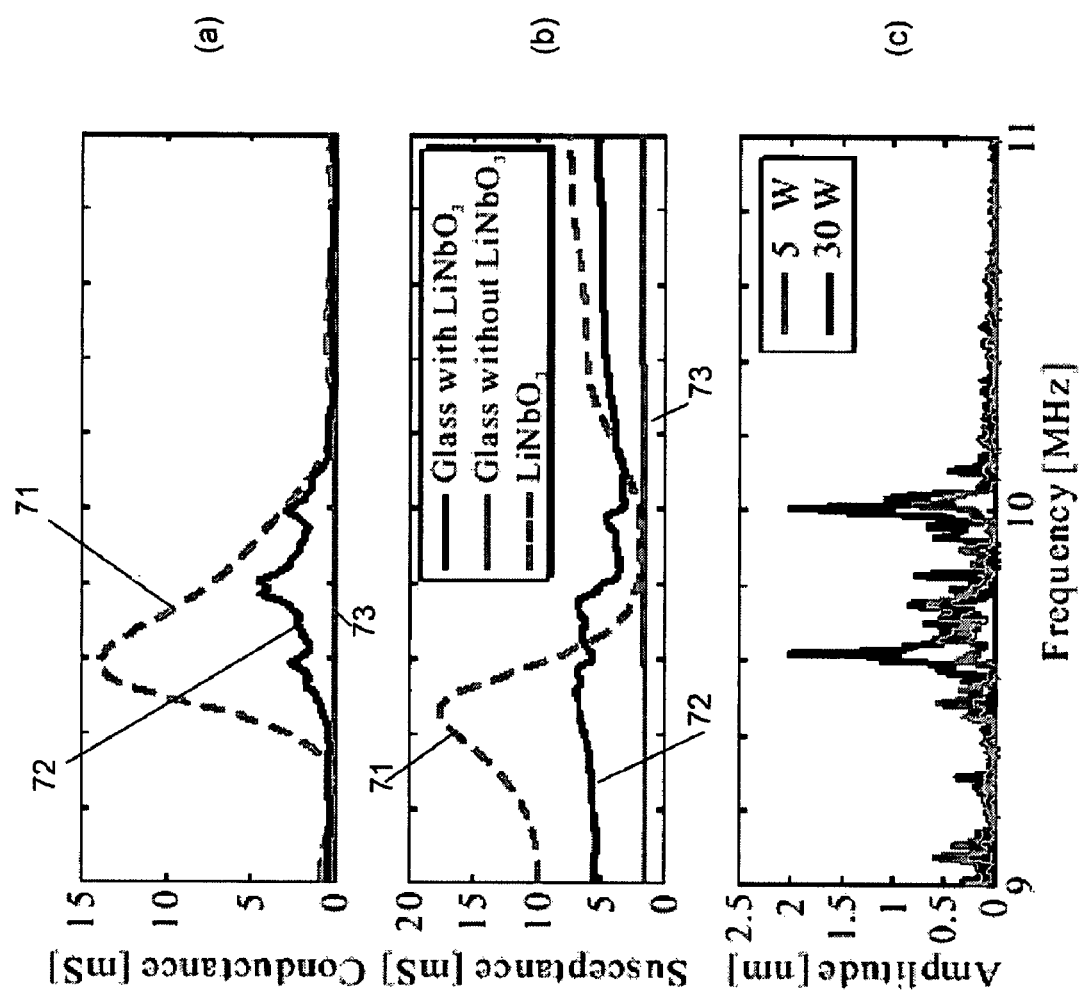
[Fig. 5]

[Fig. 6]
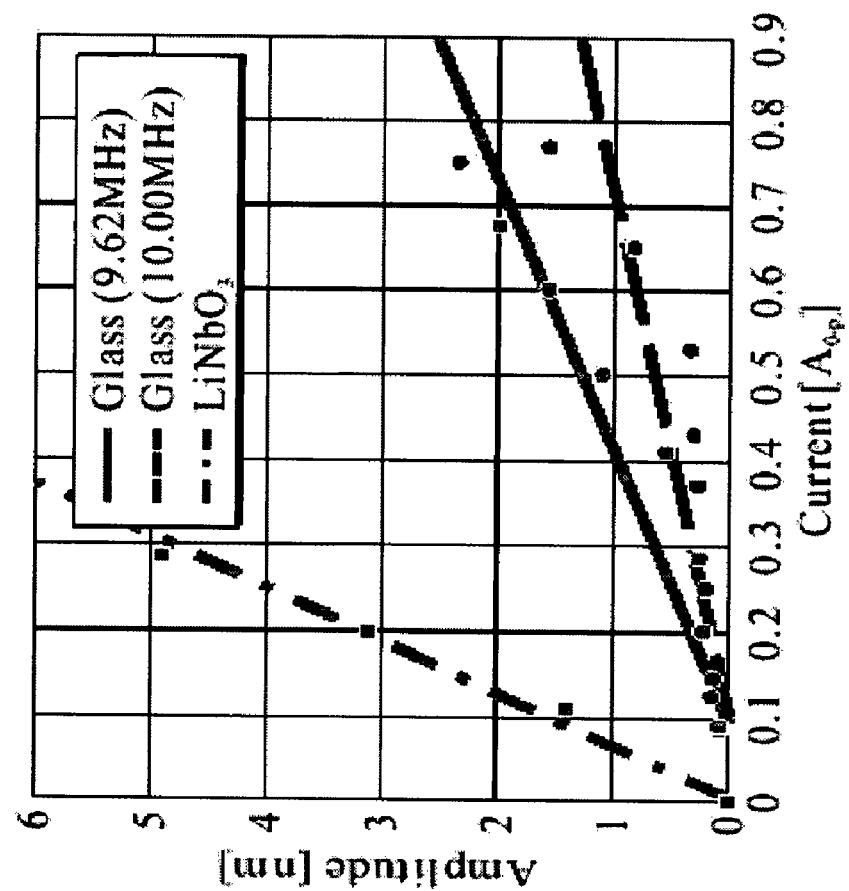

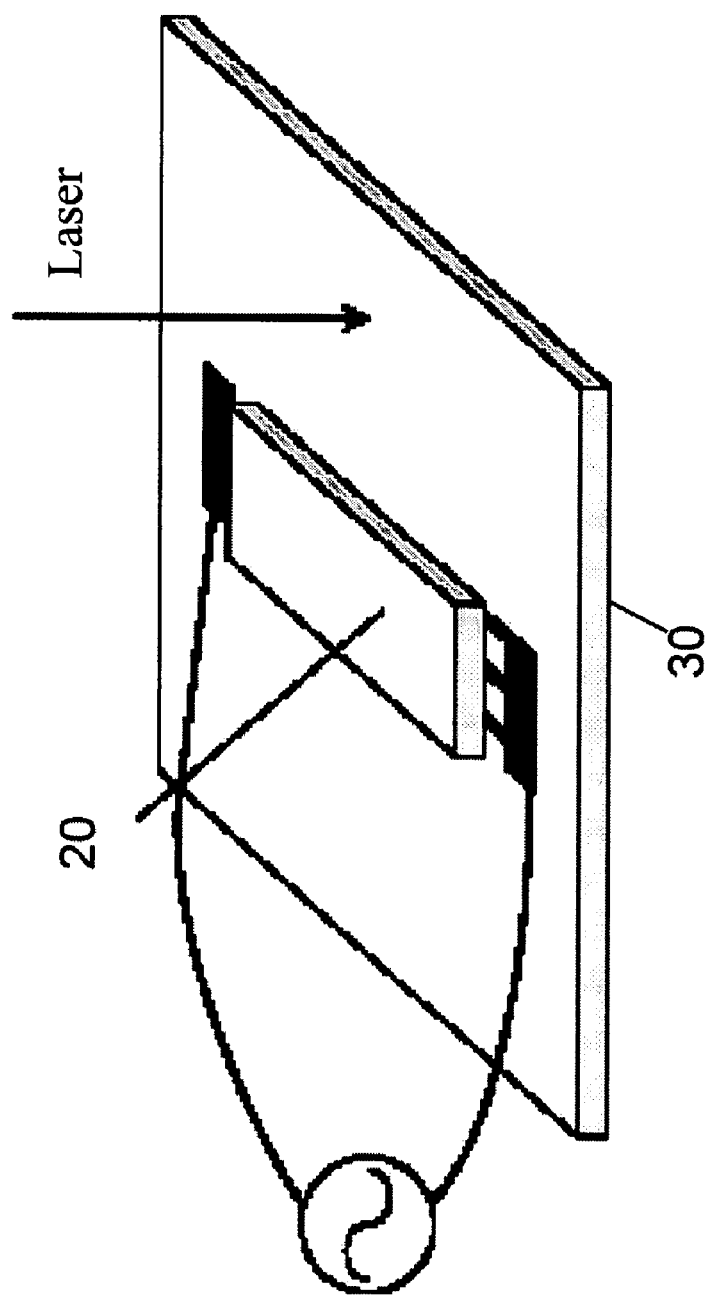
[Fig. 7]

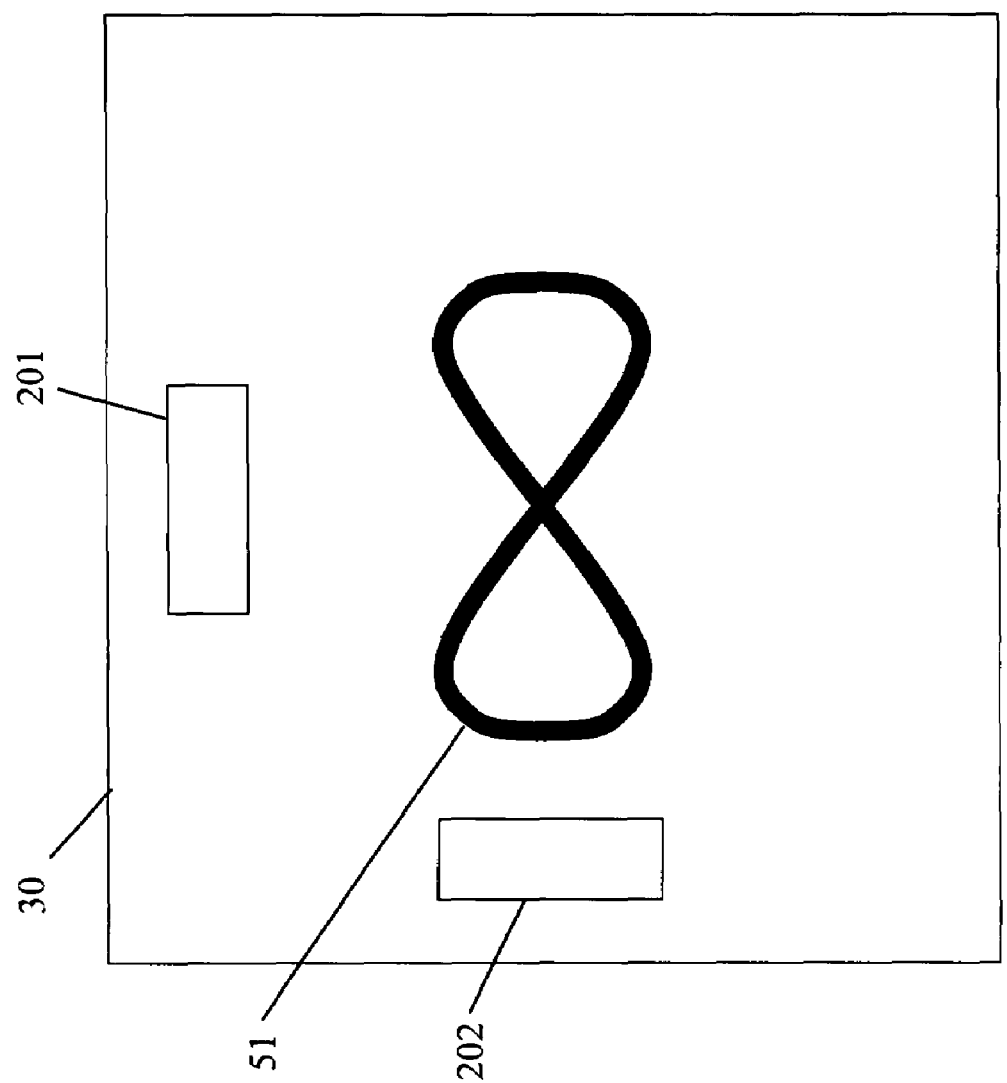
[Fig. 8]

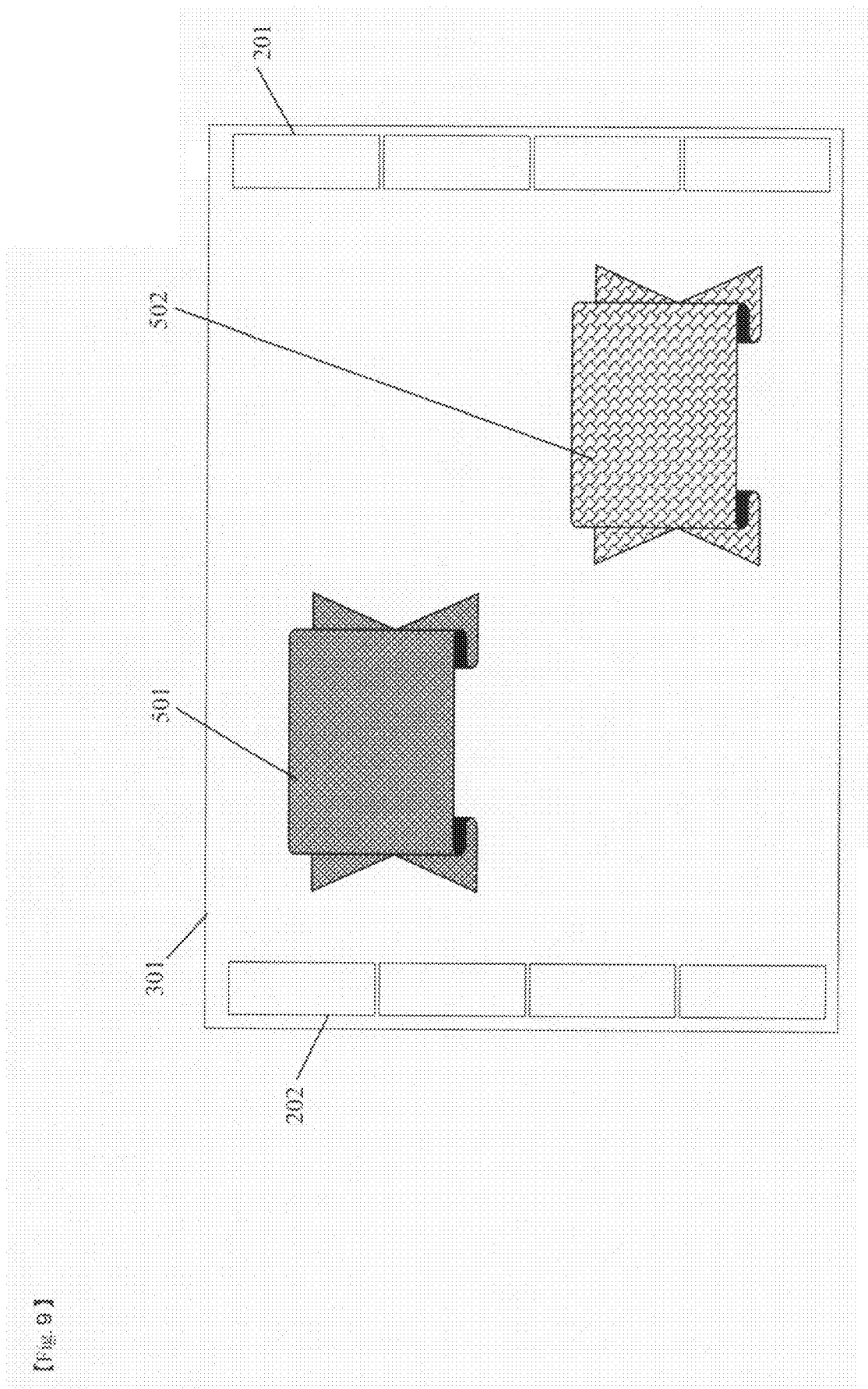

[Fig. 10]
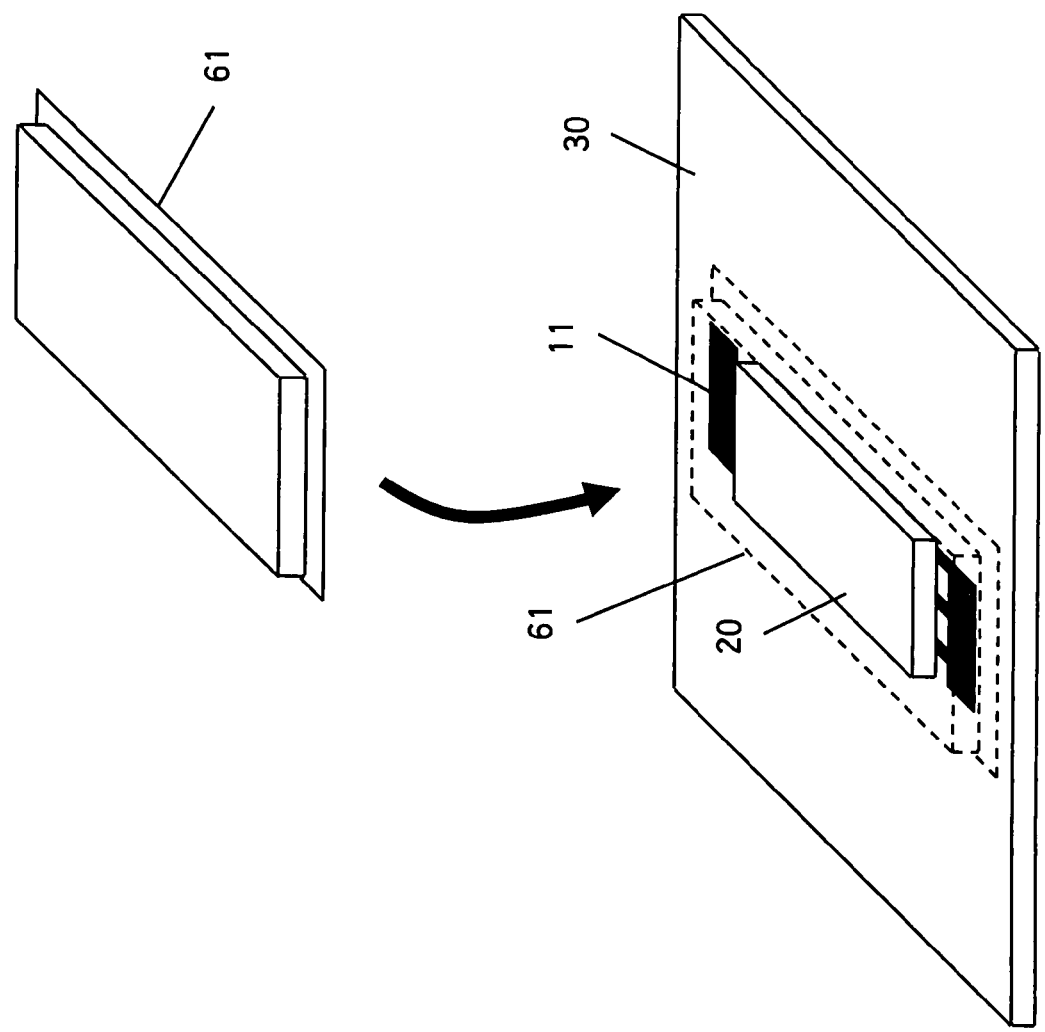

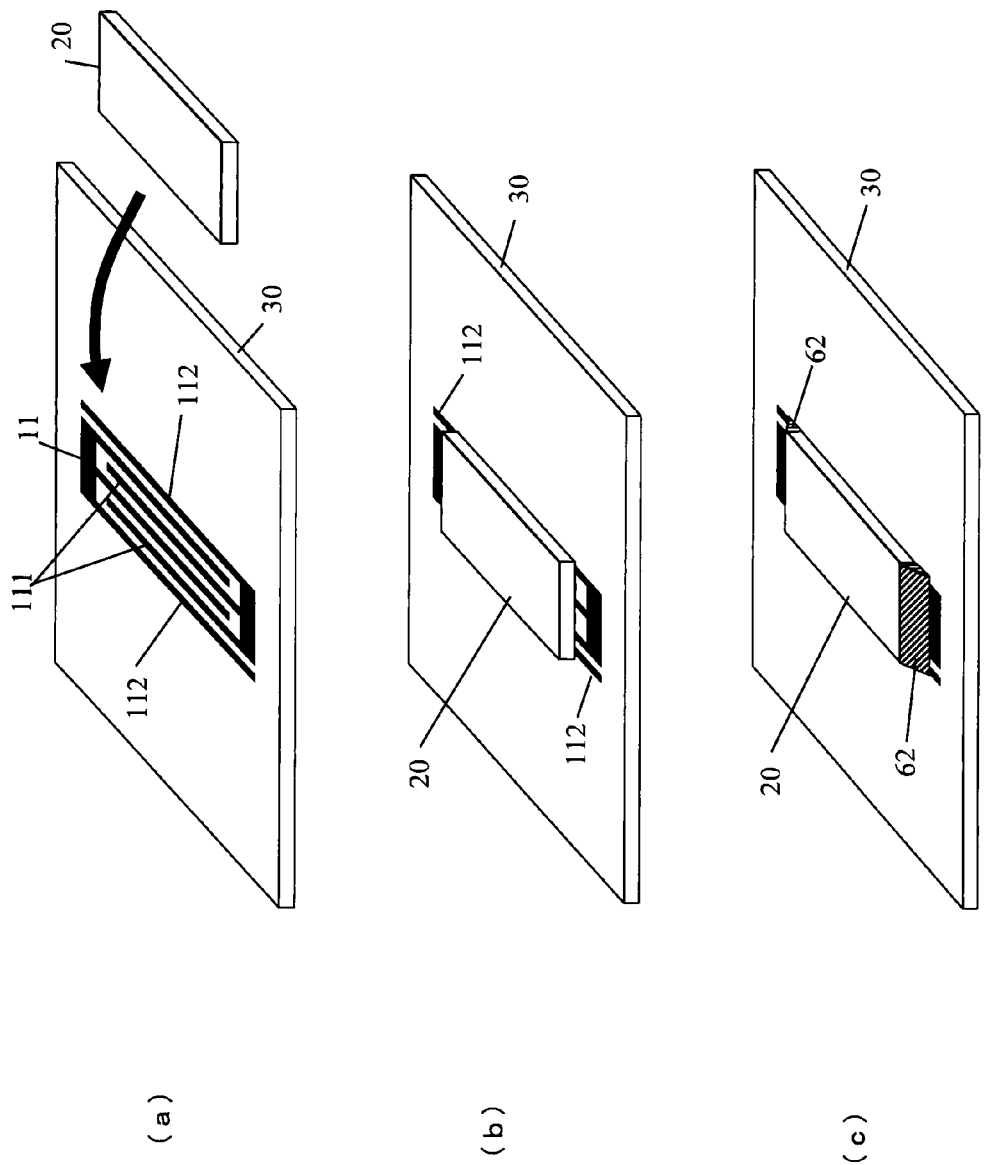

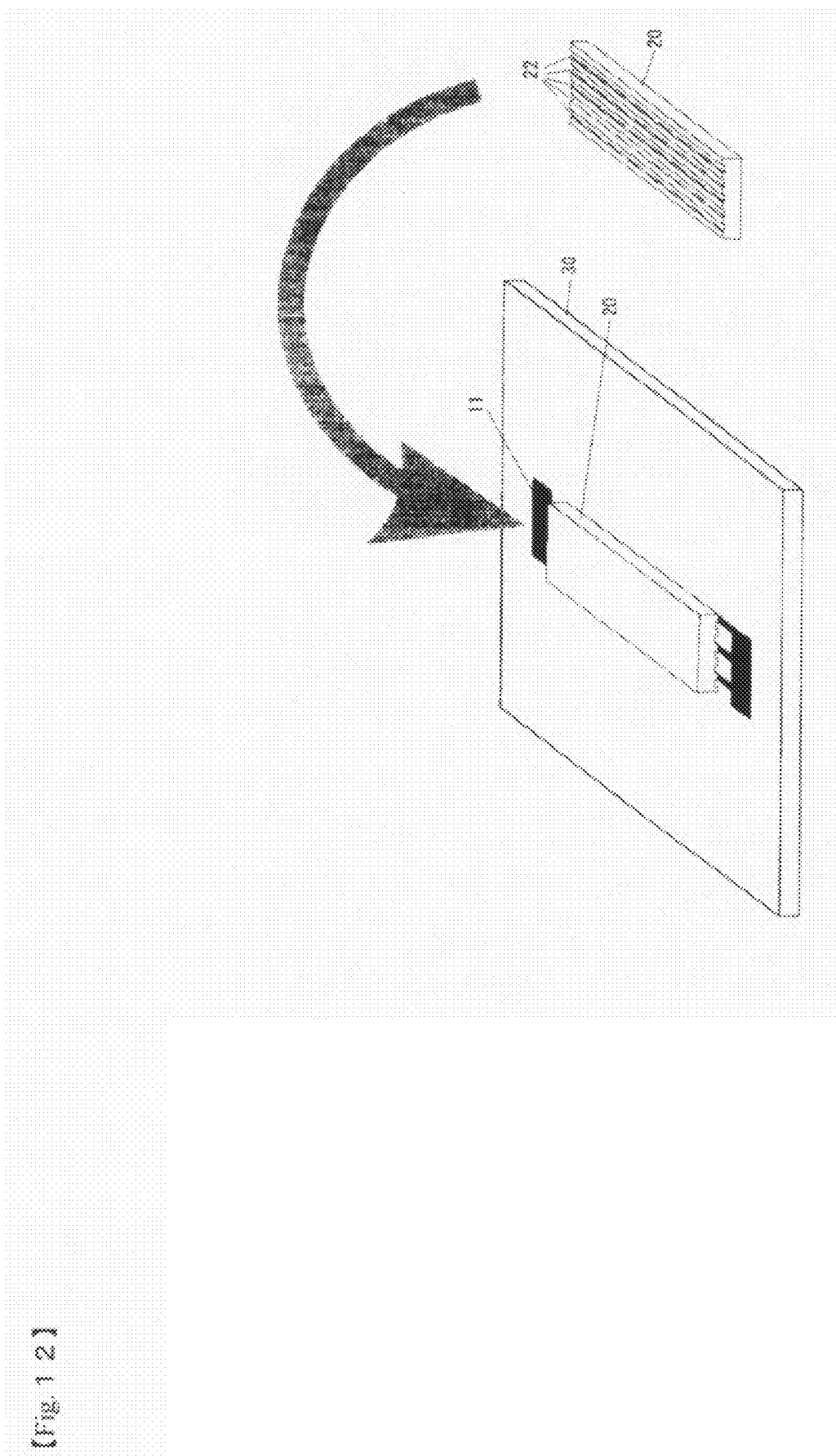
[Fig. 12]

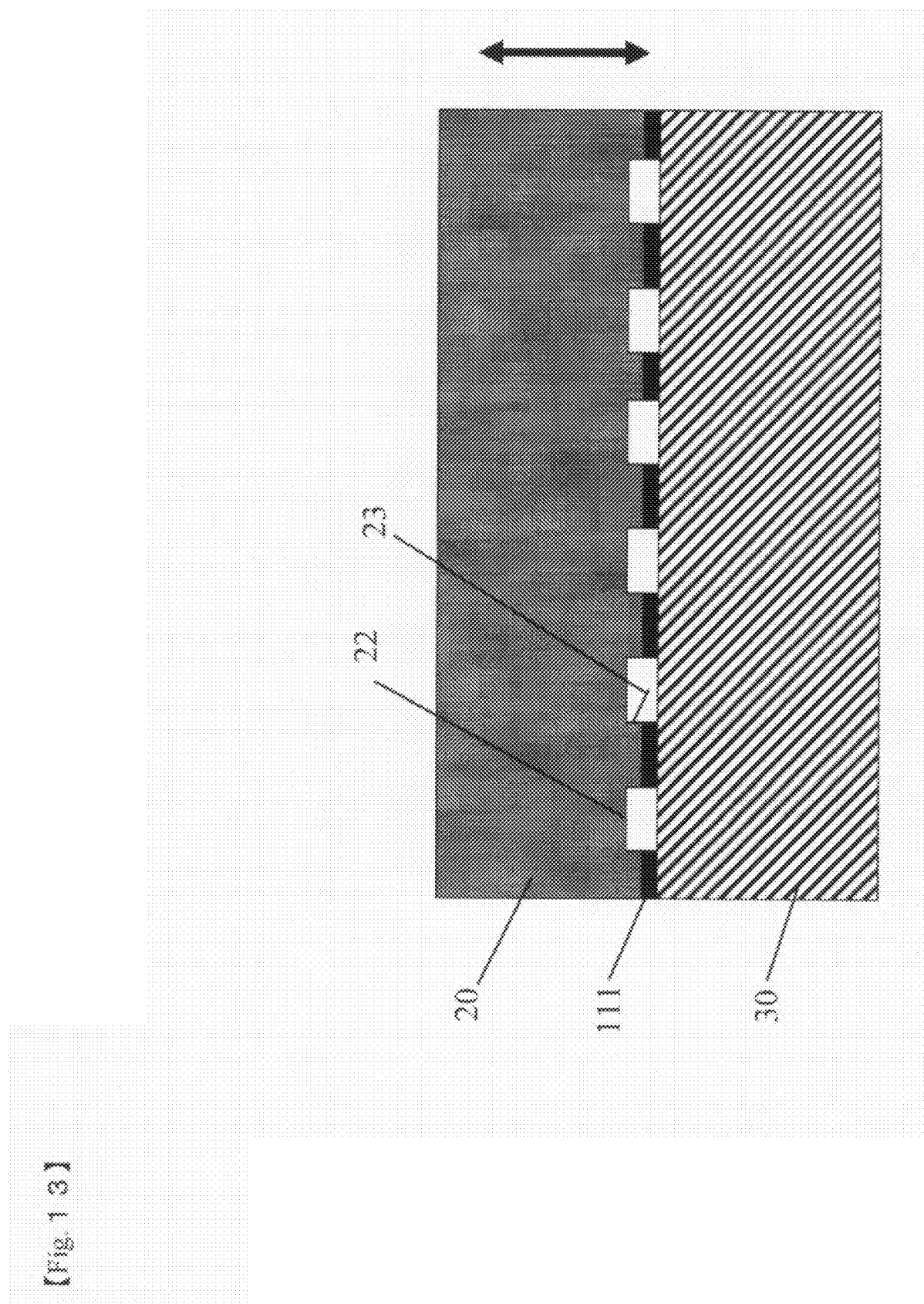
[Fig. 13]

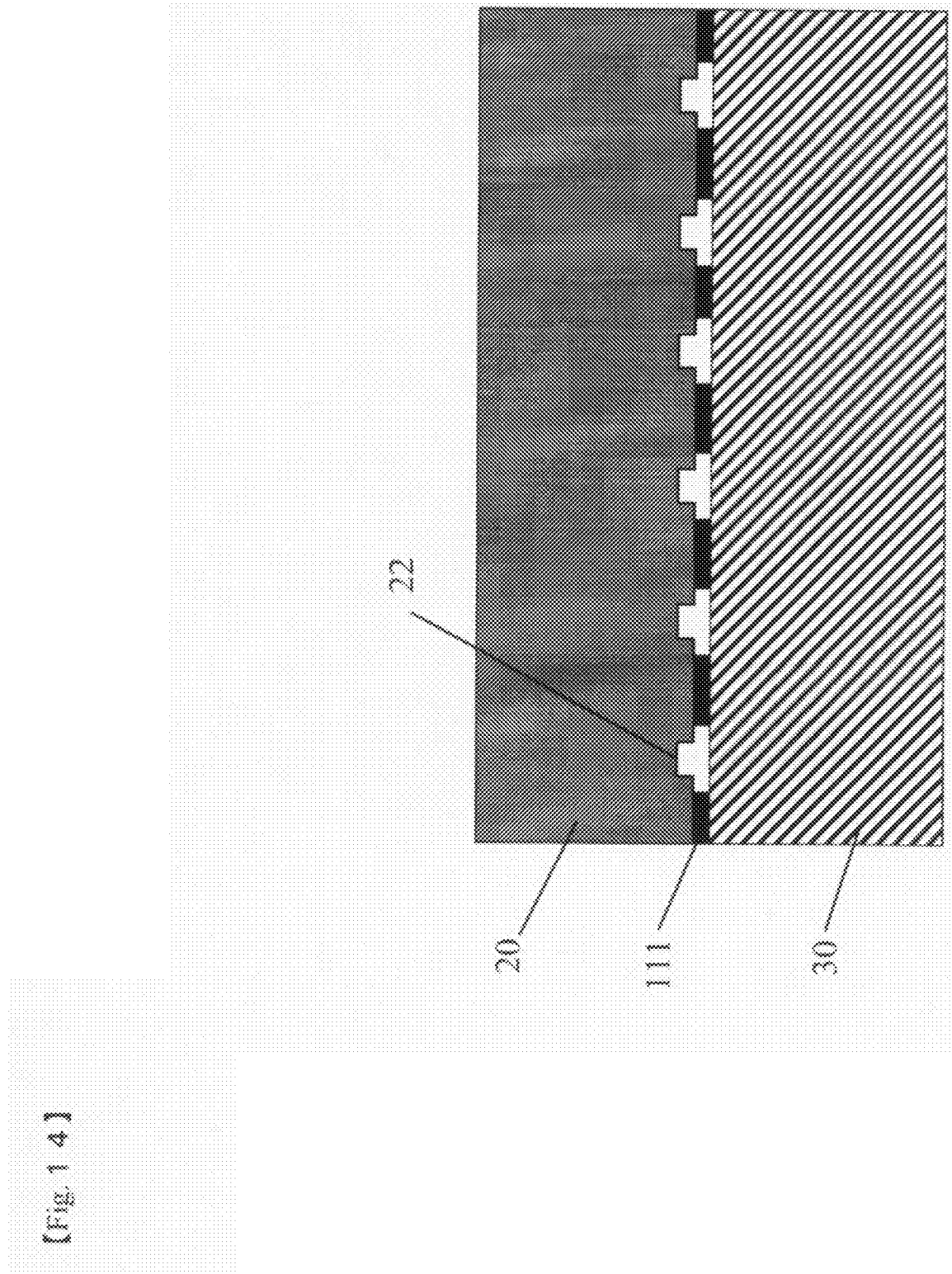
[Fig. 14]

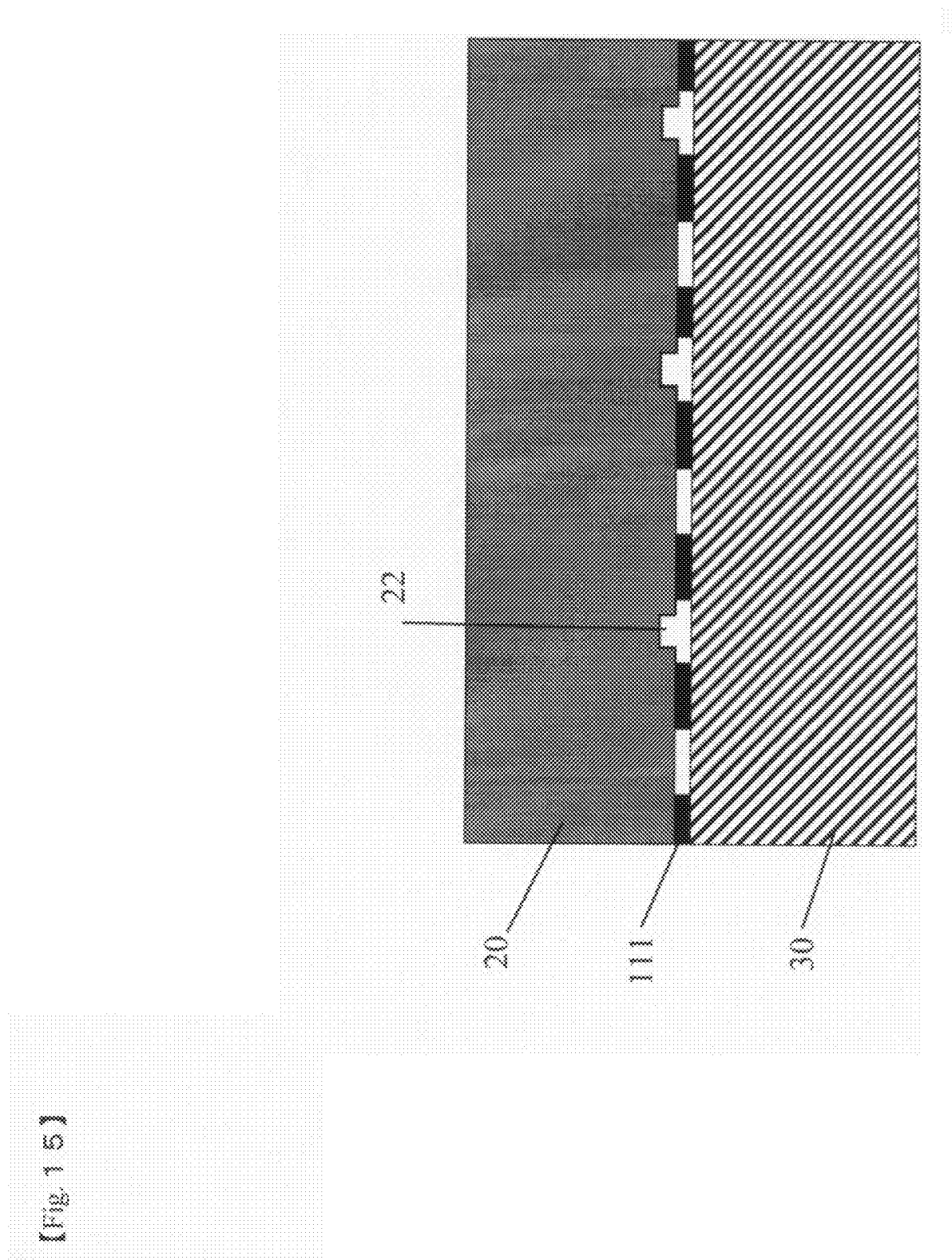
[Fig. 15]

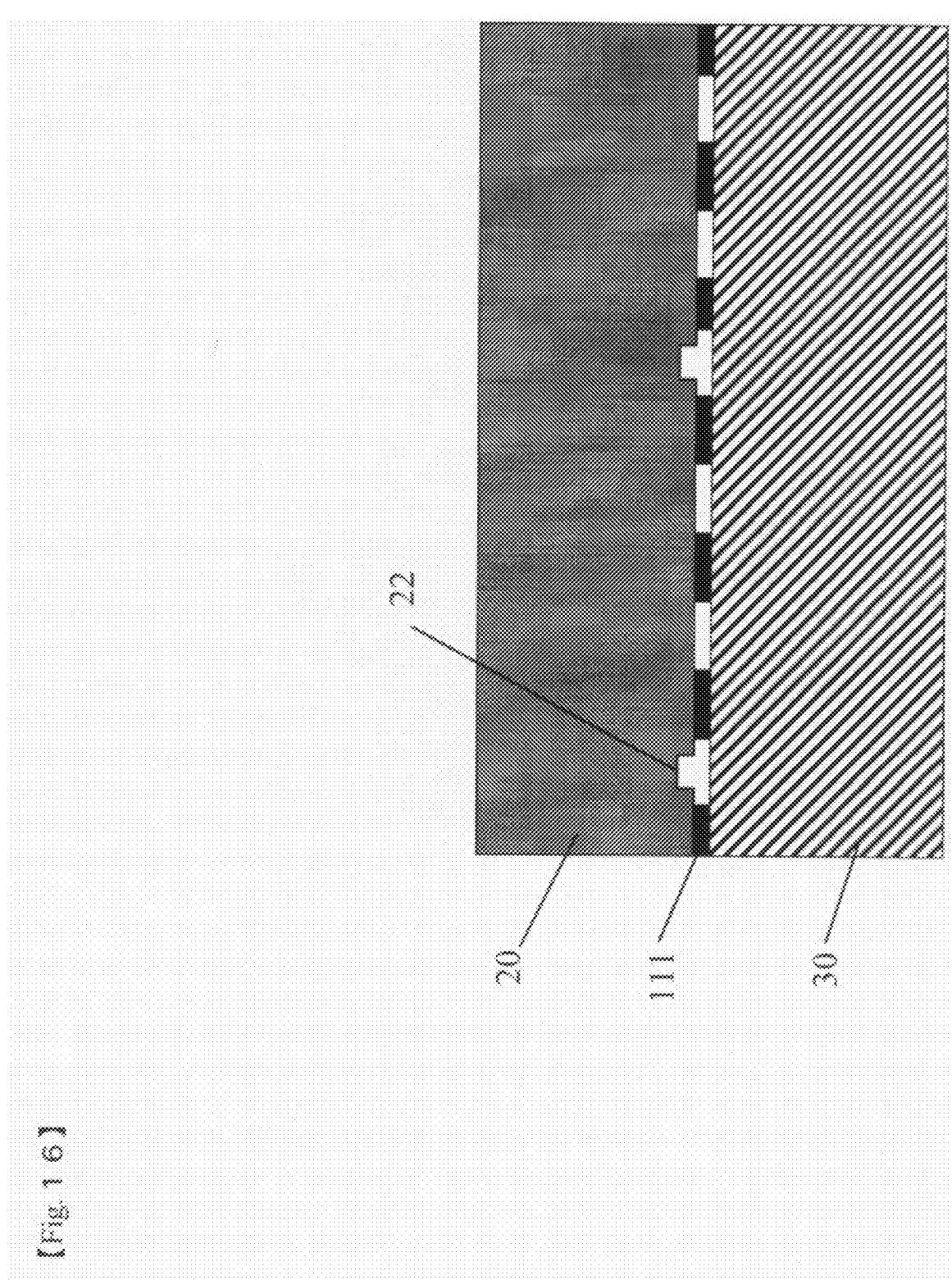
[Fig. 16]

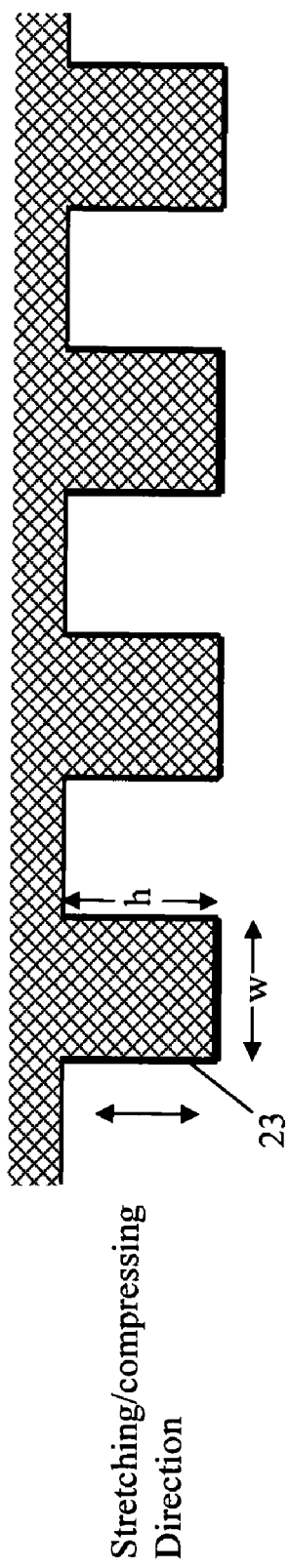
[Fig. 17]

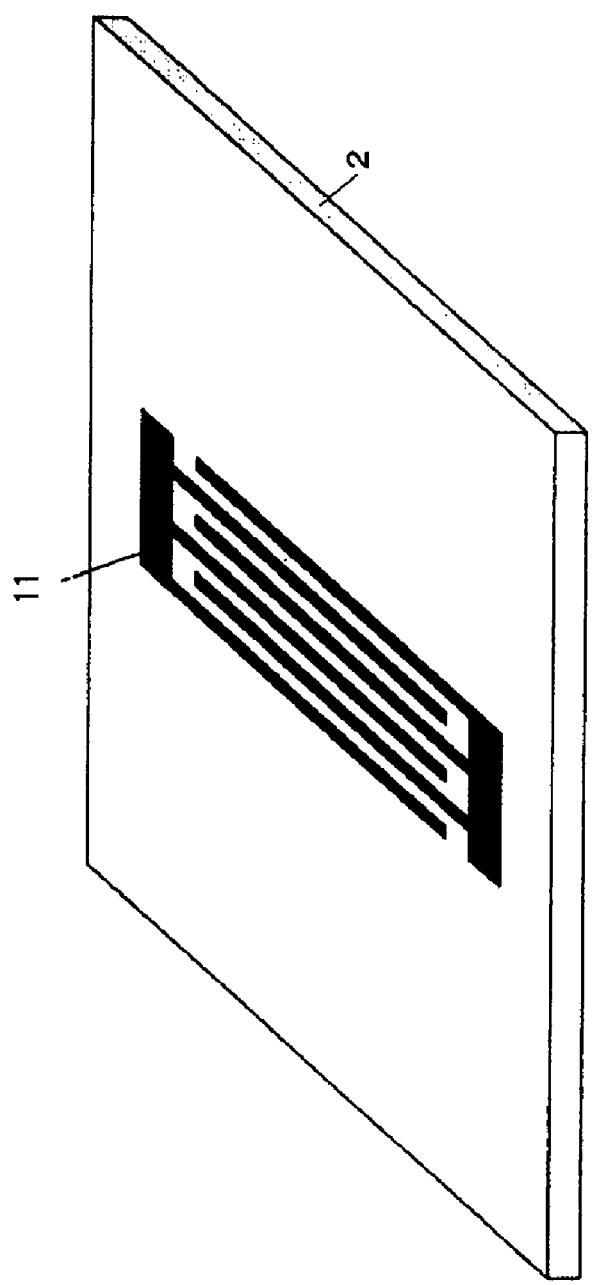
[Fig. 18]

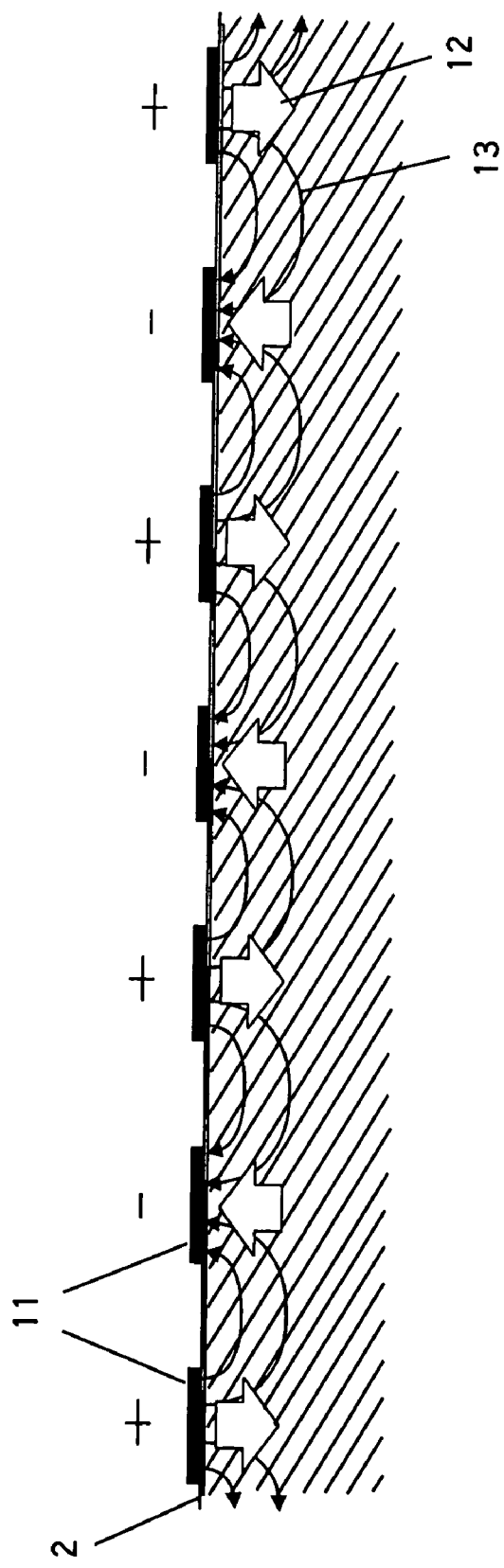
[Fig. 19]

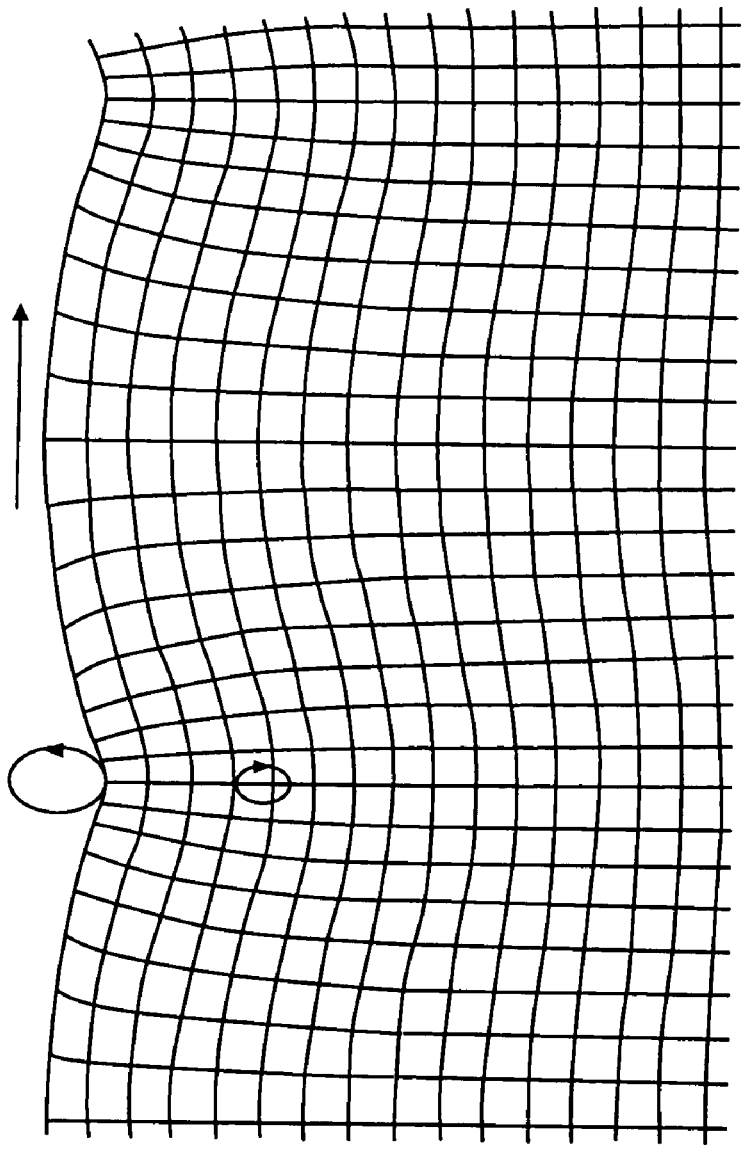
[Fig. 20]

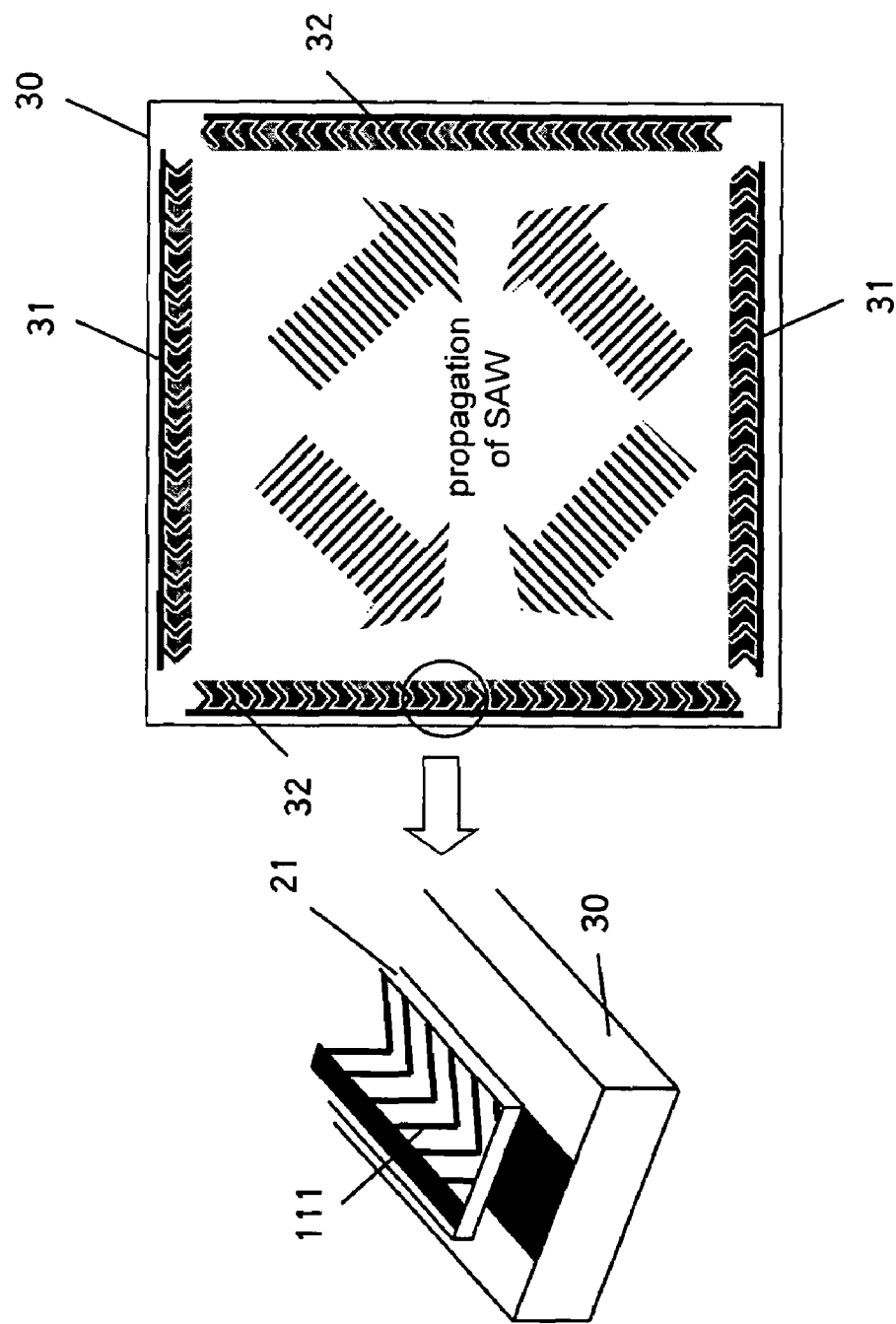
[Fig. 21]

SURFACE ACOUSTIC WAVE EXCITATION DEVICE

FIELD OF INVENTION

The present invention relates to a device for exciting a surface acoustic wave (SAW) on a non-piezoelectric material such as glass or the like, more specifically to a technology for enabling to effectively generating a surface acoustic wave on a non-piezoelectric material.

BACKGROUND OF THE INVENTION

A surface acoustic wave that is a kind of ultrasonic vibrations is utilized for devices such as filters, resonators or the like for communication purpose. Also, extensive studies have been made on applications to sensors, actuators, etc.

As illustrated in FIG. 18, a surface acoustic wave can be generated on a surface of a piezoelectric substrate 2 by applying alternating voltage between interdigital transducers 11 having alternating finger electrodes formed on the piezoelectric substrate 2.

At this time, strains 12 in opposite directions to each other are caused on the piezoelectric substrate 2 at locations near the minus and plus finger electrodes due to electric field 13 at the peripheral areas of such finger electrodes as shown in FIG. 19. The plus/minus polarities of the finger electrodes 11 reverse depending on the alternating voltage and thus orientations of the strains 12 that occur near the finger electrodes 11 periodically reverse, thereby causing a surface acoustic wave on the piezoelectric substrate 2. The frequency of the surface acoustic wave is determined by the geometry (i.e., pitch of the finger electrodes) of the interdigital transducer 11 and the generated surface acoustic wave propagates in the left-right directions in FIG. 18. In other words, the piezoelectric substrate 2 also acts as a medium for propagating the surface acoustic wave. When the surface acoustic wave propagates on the piezoelectric substrate 2, an elliptical movement of particles occurs near the surface of the piezoelectric substrate 2 as graphically illustrated in cross section view in FIG. 20.

In case of communication filters, receiving interdigital transducers having the identical geometry are disposed on the piezoelectric substrate 2 at a distance from the interdigital transducers 11 for converting the surface acoustic wave propagated on the piezoelectric substrate 2 into an electrical signal in the receiving interdigital transducers.

The non-patent document 1 as listed hereinafter discloses "a surface acoustic wave linear motor" utilizing wave-phenomenon of a surface acoustic wave. The motor comprises a slider as a diving member disposed on a piezoelectric substrate on which the surface acoustic wave propagates. Upon pressing the slider onto the piezoelectric substrate, elliptical movement of particles on the surface of the piezoelectric substrate is transmitted to the slider by way of friction, thereby moving the slider in the opposite direction to the direction of propagation of the surface acoustic wave.

The reference document 2 as listed hereunder discloses "a tactile display" utilizing wave phenomenon of a surface acoustic wave. This device is designed to generate a vibration on the surface of a finger skin by utilizing a mechanical vibration of a surface acoustic wave that propagates on a piezoelectric substrate. The device can be attached to a button on a mouse of a PC (personal computer). When the operator traces a non-flat surface displayed on the PC display screen with a cursor using the mouse, a SAW driving signal of the device is modulated in accordance with the cursor position, thereby enabling the operator to feel at his/her finger-tip the roughness of the displayed surface.

A piezoelectric single-crystal substrate such as $LiNbO_3$ or the like is widely used as the piezoelectric substrate for efficiently exciting a surface acoustic wave. Discovered more recently are materials having high electromechanical coupling coefficient in the cutting orientation of the crystal such as $KNbO_3$ or the like, that are expected to be more useful.

In a device utilizing a surface acoustic wave on a non-piezoelectric material, known is a touch panel that utilizes a surface acoustic wave for detecting touched positions as disclosed in the non-patent document 3 that is listed hereunder. As illustrated in FIG. 21, this device comprises a glass substrate 30 that enables to propagate a SAW, a pair of driving electrodes 31 and a pair of receiving electrodes 32 disposed at the periphery thereof in an opposed relationship to each other. The driving electrodes 31 and the receiving electrodes 32 comprise interdigital transducers 111 that are bent at generally right angles. The interdigital transducers 111 are formed on a piezoelectric thin film 21 that is formed on the electrode area on the glass substrate 30. A surface acoustic wave generated from the driving electrodes 31 propagates on the surface of the glass substrate 30 before being received by the receiving electrodes 32. However, when touched by a finger, the surface acoustic wave propagating on the glass substrate 30 at the touched position is attenuated. Such receiving signal is analyzed for detecting the touched position.

A touch panel utilizing a surface acoustic wave is also disclosed in the patent document 1 as listed hereunder. The touch panel comprises a plurality of piezoelectric plates having interdigital transducers formed thereon and the piezoelectric plates are firmly attached to the peripheral areas of a glass substrate with the interdigital transducers facing the glass plate.

Also disclosed in the patent document 2 as listed hereunder is an ultrasonic transducer comprising a piezoelectric thin plate having the thickness of about 220 micrometer (μm) and interdigital transducers formed thereon and a glass substrate, wherein the piezoelectric thin plate and the glass substrate are adhered to each other using epoxy resin in such a manner to sandwich the interdigital transducers therebetween.

The patent document 3 as listed hereunder also discloses a piezoelectric device comprising about 200 micrometer (μm) thick piezoelectric plate having interdigital transducers formed thereon and a glass substrate having grooves on the surface to contact with the piezoelectric member, wherein the surface of piezoelectric member opposite to the electrodes and the glass substrate are jointed to each other by way of a molten metal layer.

Patent document 1: JP 2002-196876 A

Patent document 2: JP H06-46496 A

Patent document 3: JP 2003-8094 A

Non-patent document 1: http://www.intellect.pe.u-tokyo.ac.jp/research/sawmotor/sawmotor-j.html "Surface acoustic wave linear motor"

Non-patent document 2: http://www.intellect.pe.u-tokyo.ac.jp/reserch/saw-tactile/saw-tactile-j.html "Tactile display using surface acoustic wave"

Non-patent document 3: http://pcweb.mycom.co.jp/news/2002/11/26/14.html "Clear touch panel for PDA of 98% light transmissivity"

However, piezoelectric single-crystalline substrates are difficult to fabricate and available maximum wafer size is limited to about 10 cm (or 4 inches) in diameter, thereby making the cost per substrate expensive.

In case of applying mechanical vibration of a surface acoustic wave to electro-mechanics (or mechatronics), it is required to excite surface acoustic wave over a wide range and propagate surface acoustic wave over a long distance. However, such applications are restricted by the size of piezoelectric single-crystalline substrates that excite a surface acoustic wave.

Although a surface acoustic wave is excited on a glass substrate in the touch panel as disclosed in the aforementioned non-patent document 3, the power of the surface acoustic wave propagating on the glass substrate is weak and thus making it impossible to extract the mechanical energy of a surface acoustic wave from such device for electromechanics applications.

Similarly, it is impossible to generate a surface acoustic wave having a strong power on the glass substrate in the prior art as disclosed in the aforementioned patent documents 1-3.

SUMMARY OF THE INVENTION

It is the object of the present invention to solve the aforementioned problems and to provide a surface acoustic wave excitation device capable of efficiently exciting a surface acoustic wave on the surface of a material such as glass whose shape and size can be chosen freely.

The surface acoustic wave excitation device according to the present invention comprises a non-piezoelectric member, a piezoelectric member, interdigital transducers interposed between the non-piezoelectric member and the piezoelectric member, and pre-pressurizing (preload) means for applying pressure onto the piezoelectric member against the non-piezoelectric member by way of the interdigital transducers, wherein the length of the piezoelectric member in the perpendicular direction to the finger electrodes of the interdigital transducers (i.e., the propagating direction of the surface acoustic wave) is set to cause standing waves of an acoustic wave on the piezoelectric member when alternating voltage is applied to the interdigital transducers, thereby exciting the surface acoustic wave on the non-piezoelectric member.

In this device, acoustic coupling between the piezoelectric member and the non-piezoelectric member is enhanced by the pre-pressurizing means, thereby strains by the standing waves of the surface acoustic wave generated by the piezoelectric member are transmitted to the non-piezoelectric member such as a glass substrate or the like by way of the electrodes.

In the surface acoustic wave excitation device according to the present invention, a surface acoustic wave is generated by the piezoelectric member as the acoustic wave.

In the device, standing waves of the surface acoustic wave are generated on the surface of the piezoelectric member contacting to the non-piezoelectric member.

In the surface acoustic wave excitation device according to the present invention, the length of the piezoelectric member is set to integer times of ½ wavelength of the wave propagating on the piezoelectric member.

The piezoelectric member having such length causes standing waves of an acoustic wave or a surface acoustic wave upon application of alternating voltage to the interdigital transducers.

In the surface acoustic wave excitation device according to the present invention, the pitch of the adjacent interdigitating electrodes is set to ½ wavelength of the wave propagating the non-piezoelectric member.

The surface acoustic waves generated by all finger electrodes and exciting the non-piezoelectric member are in-phase and combined together to magnify the amplitude of the surface acoustic wave.

In the surface acoustic wave excitation device according to the present invention, grooves are formed in parallel with the finger electrodes in the surface of the piezoelectric member contacting the interdigital transducers at locations not contacting the finger electrodes for enhancing acoustic coupling between the piezoelectric member and the non-piezoelectric member.

The formation of the grooves in the piezoelectric member reduces the equivalent Young's modulus for enhancing acoustic coupling between the piezoelectric member and the non-piezoelectric member even if the wavelength of the surface acoustic wave generated by the piezoelectric member differs from that of the surface acoustic wave exciting the non-piezoelectric member. Moreover, the reduced equivalent Young's modulus of the piezoelectric member improves equivalent piezoelectric coefficient of the piezoelectric member. This results in improving excitation efficiency of the surface acoustic wave on the non-piezoelectric member.

In the surface acoustic wave excitation device according to the present invention, projections are formed in the piezoelectric member in contact with the finger electrodes in such a manner to be stretched or compressed in the vertical direction with respect to the finger electrodes at the resonance frequency of the surface acoustic wave exciting the non-piezoelectric member.

Addition of the resonance vibration of the projections excites the non-piezoelectric member in large amplitude by way of the projections.

In the surface acoustic wave excitation device according to the present invention, the pre-pressurizing means is constructed to utilize vacuum sucking for pressing the piezoelectric member onto the non-piezoelectric member.

The use of vacuum sucking helps to construct the pre-pressurizing mechanism in a compact design.

The surface acoustic wave excitation device according to the present invention comprises a soft cover that covers the piezoelectric member and has a skirt portion firmly attaching the non-piezoelectric member, thereby pressing the piezoelectric member onto the non-piezoelectric member by evacuating inside of the soft cover.

Since the soft cover has significantly different mechanical impedance as compared with the piezoelectric member and the non-piezoelectric member, the soft cover is able to firmly attach the piezoelectric member and the non-piezoelectric member for firmly pressing the piezoelectric member onto the non-piezoelectric member.

In the surface acoustic wave excitation device according to the present invention, a vacuum space is provided between the piezoelectric member and the non-piezoelectric member so that the space is air-tight sealed with the parallel finger electrodes and the adhesive disposed on the side of the interdigital transducers in the perpendicular direction to the finger electrodes.

In this case, the pre-pressurizing means can be constructed within the area of the interdigital transducers in a compact design.

The surface acoustic wave excitation device according to the present invention exhibits the following advantages:

The surface acoustic wave excitation device according to the present invention is capable of efficiently excite a surface acoustic wave having a magnitude sufficient to electromechanics applications on the surface of a material such as glass whose size and shape can be freely chosen.

As a result, it is possible to excite a wide range of surface acoustic wave and propagate over a long distance, thereby widening electro-mechanics applications that utilize a surface acoustic wave.

BRIEF DESCRIPTION OF THE DRAWINGS

In the accompanying drawings:

FIG. 1 is the construction of the first embodiment of the surface acoustic wave excitation device according to the present invention;

FIG. 2 illustrates the principle of exciting the surface acoustic wave in the first embodiment of the device according to the present invention;

FIG. 3 shows the length of the piezoelectric member and the pitch of the electrodes in the first embodiment of the device according to the present invention;

FIG. 4 shows the length of the piezoelectric member and the pitch of the electrodes in the first embodiment of the device according to the present invention in case of $\lambda p=\lambda n$;

FIG. 5 shows the frequency characteristics of the first embodiment of the device according to the present invention;

FIG. 6 shows the relationship between the applied current and the vibration amplitude of the first embodiment of the device according to the present invention;

FIG. 7 illustrates how to measure the characteristics of the first embodiment of the device according to the present invention;

FIG. 8 illustrates a surface acoustic wave motor comprising the first embodiment of the device according to the present invention;

FIG. 9 illustrates a tactile display comprising the first embodiment of the device according to the present invention;

FIG. 10 illustrates a pre-pressurizing mechanism utilizing a vacuum sucking in the first embodiment of the device according to the present invention;

FIG. 11 illustrates a second pre-pressurizing mechanism utilizing a vacuum sucking in the first embodiment of the device according to the present invention;

FIG. 12 illustrates the piezoelectric member of a second embodiment of the surface acoustic wave excitation device according to the present invention;

FIG. 13 is a cross section view of the piezoelectric member, the electrodes and the glass substrate of the second embodiment of the device according to the present invention;

FIG. 14 is a cross section view of the piezoelectric member, the electrodes and the glass substrate of the second embodiment of the device according to the present invention (modification 1);

FIG. 15 is a cross section view of the piezoelectric member, the electrodes and the glass substrate of the second embodiment of the device according to the present invention (modification 2);

FIG. 16 is a cross section view of the piezoelectric member, the electrodes and the glass substrate of the second embodiment of the device according to the present invention (modification 3);

FIG. 17 illustrates the shape of the projections of the second embodiment of the device according to the present invention;

FIG. 18 shows the construction of a conventional piezoelectric device;

FIG. 19 illustrates the principle of surface acoustic wave excitation by the piezoelectric device;

FIG. 20 is a cross section view of a piezoelectric device to show how the surface acoustic wave propagates.

FIG. 21 shows the construction of a touch panel utilizing the surface acoustic wave;

DESCRIPTION OF PREFERRED
EMBODIMENTS OF THE INVENTION

Now, preferred embodiments of the surface wave excitation device according to the present invention will be described in greater details with reference to the accompanying drawings.

First Embodiment

A first embodiment of the surface acoustic wave excitation device according to the present invention comprises a non-piezoelectric glass substrate, interdigital transducers formed on the glass substrate, and a piezoelectric member mechanically coupled to the interdigital transducers. By applying alternating voltage between the interdigital transducers, changes in strain developed in the piezoelectric member propagates to the non-piezoelectric member by way of the interdigital transducers for exciting the surface acoustic wave on the non-piezoelectric member.

FIG. 1 illustrates the construction of the surface acoustic wave excitation device in the sequence of assembling it. Firstly, as shown in FIG. 1(*a*), interdigital transducers 11 having the thickness of 0.2-0.3 micrometer are formed on the non-piezoelectric glass substrate 30 by any conventional method such as evaporation, sputtering or the like. Although the shape and size of the glass substrate 30 is arbitrary, used in this particular embodiment is 20 mm×60 mm in size and 1-2 mm in thickness.

Now, as shown in FIG. 1(*b*), a piezoelectric member 20 is disposed on the finger electrodes 111 of the interdigital transducers 11. In this particular embodiment, a LiNbO$_3$ crystal of 8 mm×10 mm in size and 1 mm in thickness is used as the piezoelectric member 20.

Finally, as shown in FIG. 1(*c*), wirings 41 are connected for applying alternating voltage between the interdigital transducers 11 and a pre-pressurizing mechanism 42 is provided for compressing the piezoelectric member 20 onto the glass substrate 30 by way of the interdigital transducers 11 to pre-pressurize of 4N (contact pressure of 83.3 kPa).

By applying voltage between the interdigital transducers 11 as shown in FIG. 2, strains 12 opposite in directions near the plus and minus electrodes of the finger electrodes 111 are developed in the piezoelectric member 20 due to the electric field penetrating the piezoelectric member 20. Since the voltage applied between the finger electrodes 111 are alternating voltage, the strains are also alternating and propagate on the glass substrate 30 by way of the finger electrodes 111. As a result, there is caused distribution of strains 33 on the surface of the glass substrate 30 in the normal manner of surface acoustic wave driving mechanism. A surface acoustic wave having the frequency that is determined by the pitch of the finger electrodes 111 is excited and propagates on the surface of the glass substrate 30 in the direction as illustrated by an arrow 50 in FIG. 1(*c*).

The pre-pressurizing mechanism 42 applies pressure on the piezoelectric member 20 against the interdigital transducers 11. As a result, enhanced is an acoustic coupling between the piezoelectric member 20 and the electrodes 11 for more efficient excitation of the surface acoustic wave on the glass substrate 30. Only making junction of the piezoelectric member 20 onto the electrodes 11 and the glass substrate 30 by adhesive agent or the like is insufficient in acoustic coupling, thereby failing to strongly exciting the surface acoustic wave on the glass substrate 30.

Also, it is to be noted that the excitation efficiency of the surface acoustic wave on the glass substrate 30 is improved by setting the length L of the piezoelectric member 20 in the propagating direction 50 of the surface acoustic wave (i.e., the direction perpendicular to the finger electrodes 111 of the interdigital transducers 11) to such value that a standing wave of the surface acoustic wave is developed on the surface of the piezoelectric member 20 contacting to the non-piezoelectric member 30 or alternatively so that a standing wave of the surface acoustic wave is developed in the piezoelectric member 20.

FIG. 3 illustrates the relationship between the length L of the piezoelectric member 20 and the pitch of the finger electrodes 111 on the glass substrate 30 when the aforementioned condition is met. Let say the frequency of the generated surface acoustic wave is f and the sound velocity in the piezoelectric member 20 is Vp, wavelength λp of the surface acoustic wave generated in the piezoelectric member 20 is Vp/f. In this case, by choosing the length L of the piezoelectric member 20 in the propagating direction of the surface acoustic wave to $$L = m \times \lambda p / 2 \text{ (where, } m \text{ is integer)},$$

then, standing waves of the surface acoustic wave are developed in the piezoelectric member 20 and the glass substrate 30 is largely vibrated upon receiving the strain of the standing waves.

At this time, let say the speed of sound in the glass substrate 30 is Vn, set the pitch λn of the pair of the finger electrodes 111 to $$\lambda n = Vn/f,$$

and dispose at least a part of each finger electrode 111 in alignment with the loop (the largest amplitude portion) of the standing waves developed by the piezoelectric member 20, each standing wave on the glass substrate 30 generated from each finger electrode 111 is in-phase, thereby combining the standing waves to increase the amplitude of the surface acoustic wave on the glass substrate 30.

If the speed of sound Vp in the piezoelectric member 20 and that Vn in the glass substrate 30 are equal to each other (i.e., λp=λn), standing waves are generated in the piezoelectric member 20 to improve excitation efficiency in the glass substrate 30 by setting the length L of the piezoelectric member 20 in the propagating direction of the surface acoustic wave to integer times of the ½ pitch (i.e., λn/2) of the finger electrodes.

Incidentally, if the frequency of the surface acoustic wave is 9.6 MHz, λp in the LiNbO$_3$ is 400 μm.

FIGS. 5 and 6 are graphs showing measurement results of the surface acoustic wave excited on the glass substrate 30 in the surface acoustic wave excitation device as illustrated in FIG. 1. FIG. 7 illustrates how the measurements are made to obtain the test results in FIGS. 5 and 6 and vibration amplitudes are measured using a laser Doppler velocimeter. As shown in FIGS. 5(a) and (b), the glass substrate 30 of the surface acoustic wave excitation device has a frequency characteristic of admittance (=(conductance)+j(susceptance)) that is peculiar to a piezoelectric oscillator. It is to be noted in FIGS. 5(a) and (b) that a curve 72 shows the characteristic of the glass substrate 30 of the device, while showing as reference a curve 71 that is the characteristic of an oscillator using a conventional piezoelectric substrate (LiNbO$_3$) and a curve 73 that is the characteristic of the glass substrate 30 including only the electrodes.

FIG. 5(c) shows measurement results of the relationship between the vibration amplitude on the glass substrate 30 of the device and the frequency of the applied voltage while setting the powers applied to the electrodes to 5 watts and 30 watts. There are peaks in amplitude at the frequencies of 9.62 MHz and 10.00 MHz. It is to be noted that the peaks correspond to the frequencies where standing waves appear in the piezoelectric member 20. Plural peaks mean that there are standing waves of different number of waves.

FIG. 6 shows measurement results of the relationship between the applied current and the vibration amplitude while setting the frequencies of the voltage applied to the electrodes to 9.62 MHz and 10.00 MHz. The single dot chain line is a reference measurement result of the LiNbO$_3$, while the straight line and the broken line show characteristics of the surface acoustic wave excited by the glass substrate 30 of the device at the frequencies of 9.62 MHz and 10.00 MHz, respectively. The graphs show that the vibration amplitude increases as the applied current increases. Although the vibration amplitude is not as large as the conventional piezoelectric substrate, the available mechanical vibration is about 2 nm that can be used in electromechanics.

As understood from the above descriptions, the surface acoustic wave excitation device is able to sufficiently excite the surface acoustic wave to a sufficient magnitude of mechanical vibration that is applied to electro-mechanics on a non-piezoelectric material such as glass substrate or the like having a desired shape and size. Additionally, since the surface acoustic wave can be excited in a wider range and can be made to propagate over a long distance, it is possible to expand applications to electro-mechanics utilizing the surface acoustic wave.

For example, a slider may be disposed in the propagation path of the surface acoustic wave on the glass substrate 30 in order to implement a "surface acoustic wave motor" having a large stroke. Also, as shown in FIG. 8, the motor may be designed to set various patterns of slider moving path 51 on the glass substrate 30 by disposing a plurality of piezoelectric members 201, 202 having different propagation directions of the surface acoustic wave on the glass substrate 30 and adjusting the frequency or phase of the alternating voltage for driving the piezoelectric members 201, 202.

Moreover, the piezoelectric members 201, 202 are disposed on a screen 301 of a display device comprising a glass substrate as shown in FIG. 9 for providing a "tactile display" in which objects 501, 502 displayed on the display screen 301 can be felt by touching the screen 301 with a finger. In this case, electrodes for touch panel are separately provided (see FIG. 21) for detecting the position on the screen 301 touched by the finger. The piezoelectric members 201, 202 are then driven by a signal representing roughness of the object displayed on the screen at that position, thereby exciting the surface acoustic wave on the screen 301.

It is to be noted that the pre-pressurizing mechanism 42 to apply pressure on the piezoelectric member 20 of the surface acoustic wave excitation device against the electrodes 11 may be made in a compact design by utilizing a vacuum sucking technique. For example, as shown in FIG. 10, the piezoelectric member 20 is disposed on the interdigital transducers 11 on the glass substrate 30 and a soft cover 61 having significantly different mechanical impedance is used to cover the piezoelectric member 20 for evacuating the air inside the soft cover 61. In this configuration, vacuum is held in gaps between the piezoelectric member 20 and the glass substrate 30 at the locations where no finger electrodes are formed, thereby vacuum sucking the piezoelectric member 20 against the glass substrate 30. Also, the soft cover 61 is closely attached to the piezoelectric member 20 for firmly sticking the skirt portion of the soft cover 61 onto the glass substrate 30 for maintaining the vacuum and also pressing the piezoelectric member 20 against the glass substrate 30. It is to be noted, however, that firm sticking of the skirt portion of the soft cover 61 onto the glass substrate 30 does not prevent propagation of the surface acoustic wave on the glass substrate 30 because of softness of the cover material.

Also, the present invention may be constructed as follows. As illustrated in FIG. 11, interdigital transducers 11 having the outermost finger electrodes 112 extending longer than the inner finger electrodes 111 are formed on the glass substrate 30 (see FIG. 11(a)). The glass substrate 30 is disposed in a vacuum chamber and the piezoelectric member 20 is placed in such a manner to ride on the both finger electrodes 112 (see FIG. 11(b)). Then, adhesive 62 is dropped at ends of the piezoelectric member 20 crossing with the finger electrodes 112 at right angles and the glass substrate 30 is removed from the vacuum chamber when the adhesive 62 has been hardened (see FIG. 11(c)).

In this way, the piezoelectric member 20 that is placed on the finger electrodes of about 0.2-0.3 μm in thickness has a vacuum space between the glass substrate 30 that is surrounded by the finger electrodes 112 and the adhesive 62, thus vacuum sucked onto the glass substrate 30. The vacuum is maintained despite exposure to the surface acoustic wave of several nm in amplitude because the layer of the finger electrodes is constantly pressed by the piezoelectric member 20 in the vacuum condition. Moreover, the vacuum space is maintained despite non-uniform thickness of the finger electrodes on the glass substrate 30 because the adhesive 62 can deform incompliance with such unevenness.

Since the pre-pressurizing mechanism remains inside the area of the interdigital transducers 11 in this particular device, there causes no adverse effect on propagation of the surface acoustic wave on the glass substrate 30. Moreover, the pre-pressure applied by the pre-pressurizing mechanism can be adjusted by varying the degree of vacuum. The extended ends of the finger electrodes 112 may be used as connection ends of the interdigital transducers 11.

It is to be noted that the glass substrate 30 for exciting the surface acoustic wave in the surface acoustic wave excitation device may be curved.

Although it has been described hereinabove that the interdigital transducers 11 are formed on the glass substrate 30, it is possible to form the interdigital transducers 11 on the piezoelectric member 20 so that the piezoelectric member 20 is pressed onto the glass substrate 30 by way of the interdigital transducers 11.

Second Embodiment

Now, a description will be given on a second embodiment of the present invention in which an improvement is made to further enhance surface acoustic wave excitation efficiency of the first embodiment.

In this device as shown in FIG. 12, grooves 22 are provided in the piezoelectric member 20 to be disposed on the finger electrodes of the interdigital transducers 11 that are formed on the glass substrate 30. The other constructions are the same as the first embodiment.

FIG. 13 is a cross section view of the piezoelectric member 20 pressed onto the finger electrodes 111 on the glass substrate 30. The grooves 22 are formed periodically in the piezoelectric member 20 at the locations not to contact with the finger electrodes 111. It is the grooves 22 to equivalently reduce Young's modulus of the piezoelectric member 20 in the directions as represented by the arrows. Accordingly, even if the wavelength of the surface acoustic wave generated by the piezoelectric member 20 differs from that of the surface acoustic wave excited on the glass substrate 30, the reduced equivalent Young's modulus of the piezoelectric member 20 enhances the acoustic coupling between the piezoelectric member 20 and the finger electrodes 111 (and the glass substrate 30). Moreover, the reduced equivalent Young's modulus of the piezoelectric member 20 improves the equivalent piezoelectric coefficient. The foregoing modifications help to improve excitation efficiency of the surface acoustic wave for the glass substrate 30.

It is to be noted that the width of the grooves 22 in the piezoelectric member 20 may be shorter than the space between the adjacent finger electrodes as shown in FIG. 14. Alternatively, the pitch of the grooves 22 may be integer number times of the pitch of the finger electrodes as shown in FIGS. 15 and 16.

The grooves 22 in the piezoelectric member 20 act as larger capacity vacuum chambers in case of applying vacuum sucking means as described hereinabove with reference to the pre-pressurizing mechanism in the first embodiment (FIGS. 10 and 11). As a result, the piezoelectric member 20 and the glass substrate 30 are firmly and stably pressed to each other.

In another perspective of the device in FIG. 13, provision of the grooves 22 in the piezoelectric member 20 means that the piezoelectric member 20 transmits mechanical vibrations to the finger electrodes 111 and the glass substrate 30 by way of projections (or protrusions) 23. As illustrated in FIG. 17, the resonance frequency in the direction of stretching and compressing (as indicated by an arrow) in the projections 23 depends on the width w and the height h of the projections 23. If the shape of the projections 23 is set so that the resonance frequency coincides with the frequency of the surface acoustic wave generated by the piezoelectric member 20, the projections 23 resonate at the frequency of the surface acoustic wave excited on the surface of the non-piezoelectric member. Since the amplitude of the surface acoustic wave generated by the piezoelectric member 20 is added to the stretching and compressing of the projections 23 before being transmitted to the glass substrate 30, the amplitude of the surface acoustic wave excited on the glass substrate is magnified.

As understood from the above description, in the surface acoustic wave excitation device according to the present invention, resonance phenomena of the piezoelectric member such as generating standing waves by resonating the piezoelectric member 20 or causing resonance vibration in the projections 23 of the piezoelectric member 20 are utilized for more efficient excitation of the surface acoustic wave on the non-piezoelectric member.

Although the non-piezoelectric member is the glass substrate in the above description of each embodiment, it is to be noted that other insulating member, metal plates formed with insulating coating or the like may be used as the non-piezoelectric member.

INDUSTRIAL APPLICABILITY

The surface acoustic wave excitation device according to the present invention can find wide applications in various devices that utilize surface acoustic wave such as surface acoustic wave (ultrasonic) motors, tactile displays, etc.

What is claimed is:

1. A surface acoustic wave excitation device comprising a non-piezoelectric member made of a glass, a piezoelectric member, interdigital transducers constituting a pair of the finger electrodes interposed between the non-piezoelectric member and the piezoelectric member, and pre-pressurizing means for applying pressure onto the piezoelectric member against the non-piezoelectric member by way of the interdigital transducers, wherein the length of the piezoelectric member in the perpendicular direction to the finger electrodes of the interdigital transducers is set to integer times of the ½ wavelength of the wave propagating on the piezoelectric member to cause standing waves of an acoustic wave on the piezoelectric member when alternating voltage is applied to the interdigital transducers, thereby exciting the surface acoustic wave on the non-piezoelectric member.

2. A surface acoustic wave excitation device of claim 1, wherein the pitch of the adjacent finger electrodes is set to ½ wavelength of the wave propagating the non-piezoelectric member.

3. A surface acoustic wave excitation device of claim 1, wherein grooves for enhancing acoustic coupling between the piezoelectric member and the non-piezoelectric member are provided in parallel with the finger electrodes in the surface of the piezoelectric member contacting the interdigital transducers but at locations not contacting the finger electrodes.

4. A surface acoustic wave excitation device of claim 3, wherein projections of the piezoelectric member that contact with the finger electrodes expand or contract in the vertical direction with respect to the finger electrodes in resonance with the frequency of the surface acoustic wave exciting the non-piezoelectric member.

5. A surface acoustic wave excitation device of claim 1, wherein the pre-pressurizing means presses the piezoelectric member onto the non-piezoelectric member by utilizing vacuum sucking.

6. A surface acoustic wave excitation device of claim 5, a soft cover is provided to cover the piezoelectric member and having a skirt portion for closely attaching the non-piezoelectric member, and inside of the soft cover is evacuated for pressing the piezoelectric member onto the non-piezoelectric member.

7. A surface acoustic wave excitation device of claim 5, wherein a vacuum space is provided between the piezoelectric member and the non-piezoelectric member and the space is air-tight sealed with the parallel finger electrodes and the adhesive disposed on the side of the interdigital transducers in the perpendicular direction to the finger electrodes.

\* \* \* \* \*